(12) United States Patent
Hodges et al.

(10) Patent No.: US 8,321,759 B2
(45) Date of Patent: Nov. 27, 2012

(54) METHOD AND APPARATUS FOR ERROR CORRECTION ON A MOBILE DEVICE

(75) Inventors: John W. Hodges, Ocoee, FL (US); Marc Rippen, Clearwater, FL (US); Lawrence Bach, St. Petersburg, FL (US); Lawrence Langebrake, Seminole, FL (US)

(73) Assignee: SRI International, Menlo Park, CA (US)

( * ) Notice: Subject to any disclaimer, the term of this patent is extended or adjusted under 35 U.S.C. 154(b) by 468 days.

(21) Appl. No.: 12/610,848

(22) Filed: Nov. 2, 2009

(65) Prior Publication Data

US 2011/0107179 A1    May 5, 2011

(51) Int. Cl.
*G11C 29/00* (2006.01)

(52) U.S. Cl. .......................... 714/763; 714/799; 714/800

(58) Field of Classification Search .................. 714/763, 714/799, 800
See application file for complete search history.

(56) References Cited

U.S. PATENT DOCUMENTS

| | | | | |
|---|---|---|---|---|
| 5,177,743 | A * | 1/1993 | Shinoda et al. | 714/702 |
| 6,563,745 | B1 * | 5/2003 | Ilkbahar | 365/189.07 |
| 6,996,660 | B1 * | 2/2006 | Moore et al. | 711/102 |
| 7,003,619 | B1 * | 2/2006 | Moore et al. | 711/102 |
| 2009/0172496 | A1 * | 7/2009 | Roine | 714/758 |

* cited by examiner

*Primary Examiner* — Charles Ehne

(57) ABSTRACT

A method and apparatus for distributing dynamically reconfigurable content to a mobile device is provided. One embodiment of a method for encoding a data stream to enable error correction by a receiver of the data stream includes storing a block of the data stream in a first memory array, processing the first memory array to produce a second memory array, inverting the second memory array, and storing the second memory array, as inverted, as a third memory array.

20 Claims, 21 Drawing Sheets

EXAMPLE DATA SET (IN HEX)

800

COLUMN OF M ADDRESSES → M,N

| | | | | | | | | | | |
|---|---|---|---|---|---|---|---|---|---|---|
| 0x00 | 0x00 | 0x00 | 0x00 | 0x00 | 0x00 | 0x00 | 0x00 | 0x00 | 0x00 | 0x00 |
| 0x00 | 0x00 | 0x00 | 0x00 | 0x00 | 0x00 | 0x00 | 0x00 | 0x00 | 0x00 | 0x00 |
| 0x00 | 0x00 | 0x00 | 0x00 | 0x00 | 0x00 | 0x00 | 0x00 | 0x00 | 0x00 | 0x00 |
| 0x00 | 0x00 | 0x00 | 0x00 | 0x00 | 0xFF | 0x00 | 0x00 | 0x00 | 0x00 | 0x00 |
| 0x00 | 0x00 | 0x00 | 0x00 | 0x00 | 0xFF | 0x00 | 0x00 | 0x00 | 0x00 | 0x00 |
| 0x00 | 0x00 | 0x00 | 0xFF | 0xFF | 0xFF | 0xFF | 0xFF | 0x00 | 0x00 | 0x00 |
| 0x00 | 0x00 | 0x00 | 0x00 | 0xFF | 0x00 | 0x00 | 0x00 | 0x00 | 0x00 | 0x00 |
| 0x00 | 0x00 | 0x00 | 0x00 | 0x00 | 0xFF | 0x00 | 0x00 | 0x00 | 0x00 | 0x00 |
| 0x00 | 0x00 | 0x00 | 0x00 | 0x00 | 0x00 | 0x00 | 0x00 | 0x00 | 0x00 | 0x00 |
| 0x00 | 0x00 | 0x00 | 0x00 | 0x00 | 0x00 | 0x00 | 0x00 | 0x00 | 0x00 | 0x00 |
| 0x00 | 0x00 | 0x00 | 0x00 | 0x00 | 0x00 | 0x00 | 0x00 | 0x00 | 0x00 | 0x00 |

0,0

ROW OF N ADDRESSES

FIG. 8

BLOCK 3:

| COLUMN ADDRESS | | | | | | | ROW ADDRESS | | | | | | | FIELD | | | CHECK WORD | | | | | | | | | |
|---|---|---|---|---|---|---|---|---|---|---|---|---|---|---|---|---|---|---|---|---|---|---|---|---|---|
| m6 | m5 | m4 | m3 | m2 | m1 | m0 | n5 | n4 | n3 | n2 | n1 | n0 | x2 | x1 | x0 | cw 0 | cw 1 | cw 2 | cw 3 | cw 4 | cw 5 | cw 6 | cw 7 | cw 8 | cw 9 |

BLOCK 4:

| DATA | | | | | | | | | | | | | | | | CHECK WORD | | | | | | | | | |
|---|---|---|---|---|---|---|---|---|---|---|---|---|---|---|---|---|---|---|---|---|---|---|---|---|---|
| d15 | d14 | d13 | d12 | d11 | d10 | d9 | d8 | d7 | d6 | d5 | d4 | d3 | d2 | d1 | d0 | cw 0 | cw 1 | cw 2 | cw 3 | cw 4 | cw 5 | cw 6 | cw 7 | cw 8 | cw 9 |

Example Data Set Showing Normalization Seed Shown In Column 0

| | | | | | | | | | | | |
|---|---|---|---|---|---|---|---|---|---|---|---|
| | 0x00 | 0x00 | 0x00 | 0x00 | 0x00 | 0x00 | 0x00 | 0x00 | 0x00 | 0x00 | 0x00 |
| | 0x00 | 0x00 | 0x00 | 0x00 | 0x00 | 0x00 | 0x00 | 0x00 | 0x00 | 0x00 | 0x00 |
| | 0x00 | 0x00 | 0x00 | 0x00 | 0x00 | 0x00 | 0x00 | 0x00 | 0x00 | 0x00 | 0x00 |
| | 0x00 | 0x00 | 0x00 | 0x00 | 0x00 | 0xFF | 0x00 | 0x00 | 0x00 | 0x00 | 0x00 |
| | 0x00 | 0x00 | 0x00 | 0x00 | 0x00 | 0xFF | 0x00 | 0x00 | 0x00 | 0x00 | 0x00 |
| | 0xFF | 0x00 | 0x00 | 0xFF | 0xFF | 0xFF | 0xFF | 0xFF | 0x00 | 0x00 | 0x00 |
| | 0x00 | 0x00 | 0x00 | 0x00 | 0x00 | 0xFF | 0x00 | 0x00 | 0x00 | 0x00 | 0x00 |
| | 0x00 | 0x00 | 0x00 | 0x00 | 0x00 | 0xFF | 0x00 | 0x00 | 0x00 | 0x00 | 0x00 |
| | 0x00 | 0x00 | 0x00 | 0x00 | 0x00 | 0x00 | 0x00 | 0x00 | 0x00 | 0x00 | 0x00 |
| | 0x00 | 0x00 | 0x00 | 0x00 | 0x00 | 0x00 | 0x00 | 0x00 | 0x00 | 0x00 | 0x00 |
| | 0x00 | 0x00 | 0x00 | 0x00 | 0x00 | 0x00 | 0x00 | 0x00 | 0x00 | 0x00 | 0x00 |

Column 0 With Normalization Seed

| | COLUMN OF M ADDRESSES | | | | | | | | | | |
|---|---|---|---|---|---|---|---|---|---|---|---|
| R O W   O F   N   A D D R E S S E S | 0x00 | 0x00 | 0x00 | 0x00 | 0x00 | 0x00 | 0x00 | 0x00 | 0x00 | 0x00 | 0x00 |
| | 0x00 | 0x00 | 0x00 | 0x00 | 0x00 | 0x00 | 0x00 | 0x00 | 0x00 | 0x00 | 0x00 |
| | 0x00 | 0x00 | 0x00 | 0x00 | 0x00 | 0x00 | 0x00 | 0x00 | 0x00 | 0x00 | 0x00 |
| | 0x00 | 0x00 | 0x00 | 0x00 | 0x00 | 0xFF | 0x00 | 0x00 | 0x00 | 0x00 | 0x00 |
| | 0x00 | 0x00 | 0x00 | 0x00 | 0x00 | 0xFF | 0x00 | 0x00 | 0x00 | 0x00 | 0x00 |
| | 0xFF | 0xFF | 0xFF | 0x00 | 0x00 | 0x00 | 0x00 | 0x00 | 0xFF | 0xFF | 0xFF |
| | 0x00 | 0x00 | 0x00 | 0x00 | 0x00 | 0xFF | 0x00 | 0x00 | 0x00 | 0x00 | 0x00 |
| | 0x00 | 0x00 | 0x00 | 0x00 | 0x00 | 0xFF | 0x00 | 0x00 | 0x00 | 0x00 | 0x00 |
| | 0x00 | 0x00 | 0x00 | 0x00 | 0x00 | 0x00 | 0x00 | 0x00 | 0x00 | 0x00 | 0x00 |
| | 0x00 | 0x00 | 0x00 | 0x00 | 0x00 | 0x00 | 0x00 | 0x00 | 0x00 | 0x00 | 0x00 |
| | 0x00 | 0x00 | 0x00 | 0x00 | 0x00 | 0x00 | 0x00 | 0x00 | 0x00 | 0x00 | 0x00 |

Column 0 With Normalization Seed

| COLUMN OF M ADDRESSES | | | | | | | | | | |
|---|---|---|---|---|---|---|---|---|---|---|
| 0xFF | 0xFF | 0xFF | 0xFF | 0xFF | 0xFF | 0xFF | 0xFF | 0xFF | 0xFF | 0xFF |
| 0xFF | 0xFF | 0xFF | 0xFF | 0xFF | 0xFF | 0xFF | 0xFF | 0xFF | 0xFF | 0xFF |
| 0xFF | 0xFF | 0xFF | 0xFF | 0xFF | 0xFF | 0xFF | 0xFF | 0xFF | 0xFF | 0xFF |
| 0xFF | 0xFF | 0xFF | 0xFF | 0xFF | 0x00 | 0xFF | 0xFF | 0xFF | 0xFF | 0xFF |
| 0xFF | 0xFF | 0xFF | 0xFF | 0xFF | 0x00 | 0xFF | 0xFF | 0xFF | 0xFF | 0xFF |
| 0x00 | 0x00 | 0x00 | 0xFF | 0xFF | 0xFF | 0xFF | 0xFF | 0x00 | 0x00 | 0x00 |
| 0xFF | 0xFF | 0xFF | 0xFF | 0xFF | 0x00 | 0xFF | 0xFF | 0xFF | 0xFF | 0xFF |
| 0xFF | 0xFF | 0xFF | 0xFF | 0xFF | 0x00 | 0xFF | 0xFF | 0xFF | 0xFF | 0xFF |
| 0xFF | 0xFF | 0xFF | 0xFF | 0xFF | 0xFF | 0xFF | 0xFF | 0xFF | 0xFF | 0xFF |
| 0xFF | 0xFF | 0xFF | 0xFF | 0xFF | 0xFF | 0xFF | 0xFF | 0xFF | 0xFF | 0xFF |
| 0xFF | 0xFF | 0xFF | 0xFF | 0xFF | 0xFF | 0xFF | 0xFF | 0xFF | 0xFF | 0xFF |

ROW OF N ADDRESSES

Column 0 With Normalization Seed

Example Second Data Array After Reception With Random Errors

| | COLUMN OF M ADDRESSES | | | | | | | | | | |
|---|---|---|---|---|---|---|---|---|---|---|---|
| R O W   O F   N   A D D R E S S E S | 0x00 | | | | | | | | | | |
| | 0x00 | | | 0x23 | | | | | | | |
| | 0x00 | | | | | | | | | | |
| | 0x00 | | | | | 0xF7 | | | | | |
| | 0x00 | | | | | | 0xFF | | | | |
| | 0xFF | 0xAA | 0xFF | | | | | | 0x00 | 0xFF | 0xFF |
| | 0x00 | | | | | | 0xFF | | | | |
| | 0x00 | | | | | | 0xFF | | | | |
| | 0x00 | | | | | | | | | | |
| | 0x00 | | | | | | | | | | |
| | 0x00 | | | | | | | | | | |

Column 0 With
Normalization
Seed

Received
Address Error
Transposed

Example Third Data Array After Reception With Random Errors

| | COLUMN OF M ADDRESSES | | | | | | | | | |
|---|---|---|---|---|---|---|---|---|---|---|
| 0xFF | | | | | | | | | | |
| 0xFF | | | | | | | | | | |
| 0xFF | | | | | | | | | | |
| 0xFF | | | | | 0x05 | | | | | |
| 0xFF | | | | | 0xFF | | | | | |
| 0x00 | 0x00 | 0x30 | | | | | | 0x00 | 0x00 | 0x00 |
| 0xFF | | | | | 0xA5 | | | | | |
| 0xFF | | | | | 0x00 | | | | | |
| 0xFF | | | | | | | | | | |
| 0xFF | | | | | | | | | | |
| 0xFF | | | | | | | | | | |

0,0 (top-left); M,N (bottom-right)

ROW OF N ADDRESSES

Column 0 With Normalization Seed

Example Fourth Data Array After Reception With Random Errors 0,0

| COLUMN OF M ADDRESSES | | | | | | | | | | |
|---|---|---|---|---|---|---|---|---|---|---|
| 0x00 | | | | | | | | | | |
| 0x00 | | | | | | | | | | |
| 0x00 | | | | | | | | | | |
| 0x00 | | | | 0xFF | | | | | | |
| 0x00 | | | | 0xFF | | | | | | |
| 0xFF | 0xFF | 0xFF | | | | | 0xFF | 0xFF | 0xFF | |
| 0x00 | | | | 0xFF | | | | | | |
| 0x00 | | | | 0x55 | | | | | | |
| 0xAA | | | | | | | | | | |
| 0x00 | | | | | | | | | | |
| 0x00 | | | | | | | | | | |

ROW OF N ADDRESSES

Column 0 With Normalization Seed

Example Data Array D (B' XOR C') AND C'

| | COLUMN OF M ADDRESSES | | | | | | | | |
|---|---|---|---|---|---|---|---|---|---|
| 0x00 | | | | | | | | | |
| 0x00 | | | | | | | | | |
| 0x00 | | | | | | | | | |
| 0x00 | | | | | 0xFA | | | | |
| 0x00 | | | | | 0xFF | | | | |
| 0xFF | 0xAA | 0xCF | | | | | 0xFF | 0xFF | 0xFF |
| 0x00 | | | | | 0x5A | | | | |
| 0x00 | | | | | 0x55 | | | | |
| 0x00 | | | | | | | | | |
| 0x00 | | | | | | | | | |
| 0x00 | | | | | | | | | |

0,0 (top-left)

ROW OF N ADDRESSES

Column 0 With Normalization Seed

Example Data Array D A' AND C'

| | COLUMN OF M ADDRESSES | | | | | | | | | | | |
|---|---|---|---|---|---|---|---|---|---|---|---|---|
| | 0x00 | | | | | | | | | | | |
| | 0x00 | | | | | | | | | | | |
| | 0x00 | | | | | | | | | | | |
| | 0x00 | | | | 0xF7 | | | | | | | |
| | 0x00 | | | | 0xFF | | | | | | | |
| | 0xFF | 0xAA | 0xFF | | | | | | 0x00 | 0xFF | 0xFF | |
| | 0x00 | | | | 0xFF | | | | | | | |
| | 0x00 | | | | 0x55 | | | | | | | |
| | 0x00 | | | | | | | | | | | |
| | 0x00 | | | | | | | | | | | |
| | 0x00 | | | | | | | | | | | |

Column 0 With Normalization Seed

Example Data Array D Final Results

|  | COLUMN OF M ADDRESSES | | | | | | | | | | |
|---|---|---|---|---|---|---|---|---|---|---|---|
| R O W   O F   N   A D D R E S S E S | 0x00 | 0x00 | 0x00 | 0x00 | 0x00 | 0x00 | 0x00 | 0x00 | 0x00 | 0x00 | 0x00 |
| | 0x00 | 0x00 | 0x00 | 0x00 | 0x00 | 0x00 | 0x00 | 0x00 | 0x00 | 0x00 | 0x00 |
| | 0x00 | 0x00 | 0x00 | 0x00 | 0x00 | 0x00 | 0x00 | 0x00 | 0x00 | 0x00 | 0x00 |
| | 0x00 | 0x00 | 0x00 | 0x00 | 0x00 | 0xFF | 0x00 | 0x00 | 0x00 | 0x00 | 0x00 |
| | 0x00 | 0x00 | 0x00 | 0x00 | 0x00 | 0xFF | 0x00 | 0x00 | 0x00 | 0x00 | 0x00 |
| | 0xFF | 0x00 | 0x00 | 0xFF | 0xFF | 0xFF | 0xFF | 0xFF | 0x00 | 0x00 | 0x00 |
| | 0x00 | 0x00 | 0x00 | 0x00 | 0x00 | 0xFF | 0x00 | 0x00 | 0x00 | 0x00 | 0x00 |
| | 0x00 | 0x00 | 0x00 | 0x00 | 0x00 | 0xFF | 0x00 | 0x00 | 0x00 | 0x00 | 0x00 |
| | 0x00 | 0x00 | 0x00 | 0x00 | 0x00 | 0x00 | 0x00 | 0x00 | 0x00 | 0x00 | 0x00 |
| | 0x00 | 0x00 | 0x00 | 0x00 | 0x00 | 0x00 | 0x00 | 0x00 | 0x00 | 0x00 | 0x00 |
| | 0x00 | 0x00 | 0x00 | 0x00 | 0x00 | 0x00 | 0x00 | 0x00 | 0x00 | 0x00 | 0x00 |

Column 0 With
Normalization
Seed

FIG. 21

METHOD AND APPARATUS FOR ERROR CORRECTION ON A MOBILE DEVICE

FIELD OF THE INVENTION

The present invention relates generally to mobile communications, and relates more specifically to the correction of errors in content exchanged by mobile devices.

SUMMARY OF THE INVENTION

A method and apparatus for distributing dynamically reconfigurable content to a mobile device is provided. One embodiment of a method for encoding a data stream to enable error correction by a receiver of the data stream includes storing a block of the data stream in a first memory array, processing the first memory array to produce a second memory array, inverting the second memory array, and storing the second memory array, as inverted, as a third memory array.

BRIEF DESCRIPTION OF THE DRAWINGS

The teachings of the present invention can be readily understood by considering the following detailed description in conjunction with the accompanying drawings, in which:

FIG. 8 illustrates an exemplary (M+1)×N array that may be used to store a data stream;

FIG. 10 illustrates an exemplary data structure for transmitting radio broadcast data system data bits;

FIG. 12 illustrates the array of FIG. 8, in which the most likely data value for each row N is stored in the M0 column;

FIG. 13 illustrates the array of FIG. 8 after normalization;

FIG. 14 illustrates an exemplary third array in which the inverted data is stored;

FIG. 15 illustrates an exemplary second array in which random errors are contained;

FIG. 16 illustrates an exemplary third array in which random errors are contained;

FIG. 17 illustrates an exemplary fourth array in which random errors are contained;

FIG. 19 illustrates an exemplary array representing the operation (B' XOR C') AND C';

FIG. 20 illustrates an exemplary array representing the operation (A' AND C'); and FIG. 21 illustrates an exemplary sixth array in which the correction value is stored.

To facilitate understanding, identical reference numerals have been used, where possible, to designate identical elements that are common to the figures.

DETAILED DESCRIPTION

The present invention relates to a method and apparatus for error correction on a mobile device. Embodiments of the invention provide an error correction mechanism that allows users to transfer large blocks of data without error. The error correction mechanism is especially beneficial when used in conjunction with communications channels in which errors tend to be subject to long temporal fade, such as radio broadcast data system (RBDS) and radio data system (RDS) communications channels.

Figure 1:
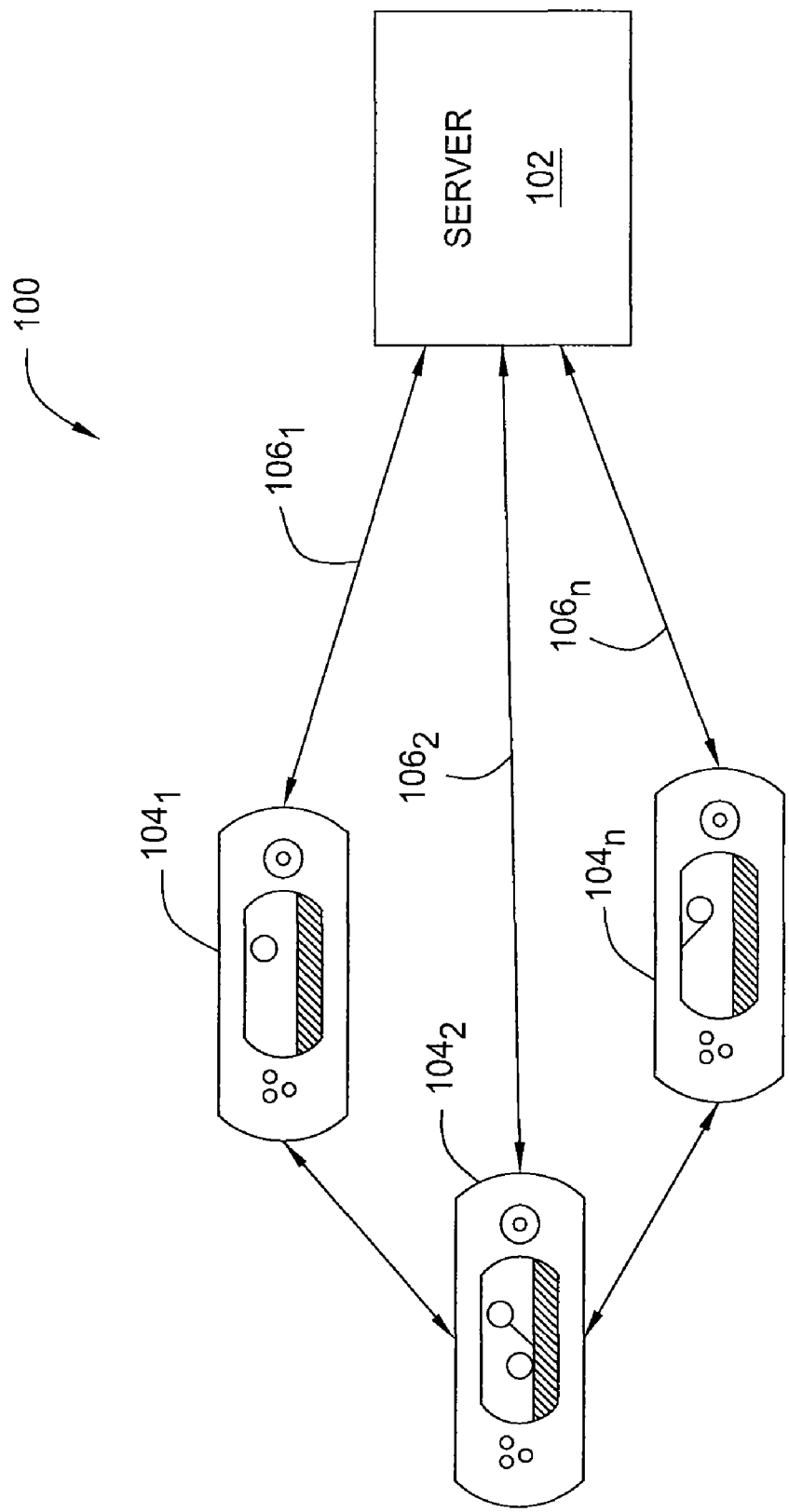
FIG. 1 is a schematic diagram illustrating one embodiment of a system for distributing dynamically reconfigurable media to a mobile device, according to the present invention.

FIG. 1 is a schematic diagram illustrating one embodiment of a system 100 in which embodiments of the present invention may be deployed. As illustrated, the system 100 comprises a server 102 and a plurality of mobile devices 104$_1$-104$_n$ (hereinafter collectively referred to as "mobile devices 104"). In one embodiment, the server 102 is coupled to the mobile devices 104 via respective bidirectional links 106$_1$-106$_n$ (hereinafter collectively referred to as "links 106") from the server 102 to the mobile devices 104. In one embodiment, the bidirectional links 106 have a range of less than approximately one hundred feet (e.g., using unlicensed short-range spectra). In another embodiment, the bidirectional links 106 have a range of up to approximately fifty miles (e.g., using leased or licensed spectra). Each of the server 102 and the mobile devices 104 is illustrated in greater detail in FIGS. 2 and 3, respectively.

In one embodiment, the server 102 is installed at a radio station. The sever 102 is configured to distribute messages containing content to the mobile devices 104. In one embodiment, this content comprises at least one of: interactive content, an image, a video, an audio clip, or text.

The mobile devices 104 are used by users to view or play the content provided by the server 102. For example, the mobile devices 104 may comprise handheld gaming systems, personal media players, mobile phones, global positioning systems, personal digital assistants, mobile computers, or the like. In a further embodiment, the mobile devices 104 are small form factor devices, such as toys or card-shaped devices that are approximately the size and shape of a credit card. These small form factor devices comprise displays and multiple button, menu-driven user interfaces and are capable of processing input and/or output comprising at least one of: audio, video, text, and images. In yet another embodiment, these small form factor devices are programmable and rechargeable through solar or universal serial bus (USB) interfaces. In one embodiment, the content received from the server 102 is locally stored on the mobile devices 104. In another embodiment, the content is streamed from the server 102 to the mobile devices 104.

In further embodiments, the mobile devices 104 communicate with each other as well as with the server 102. As such, the mobile devices 104 may exchange content with each other as well as obtain content from the server 102.

Figure 2:
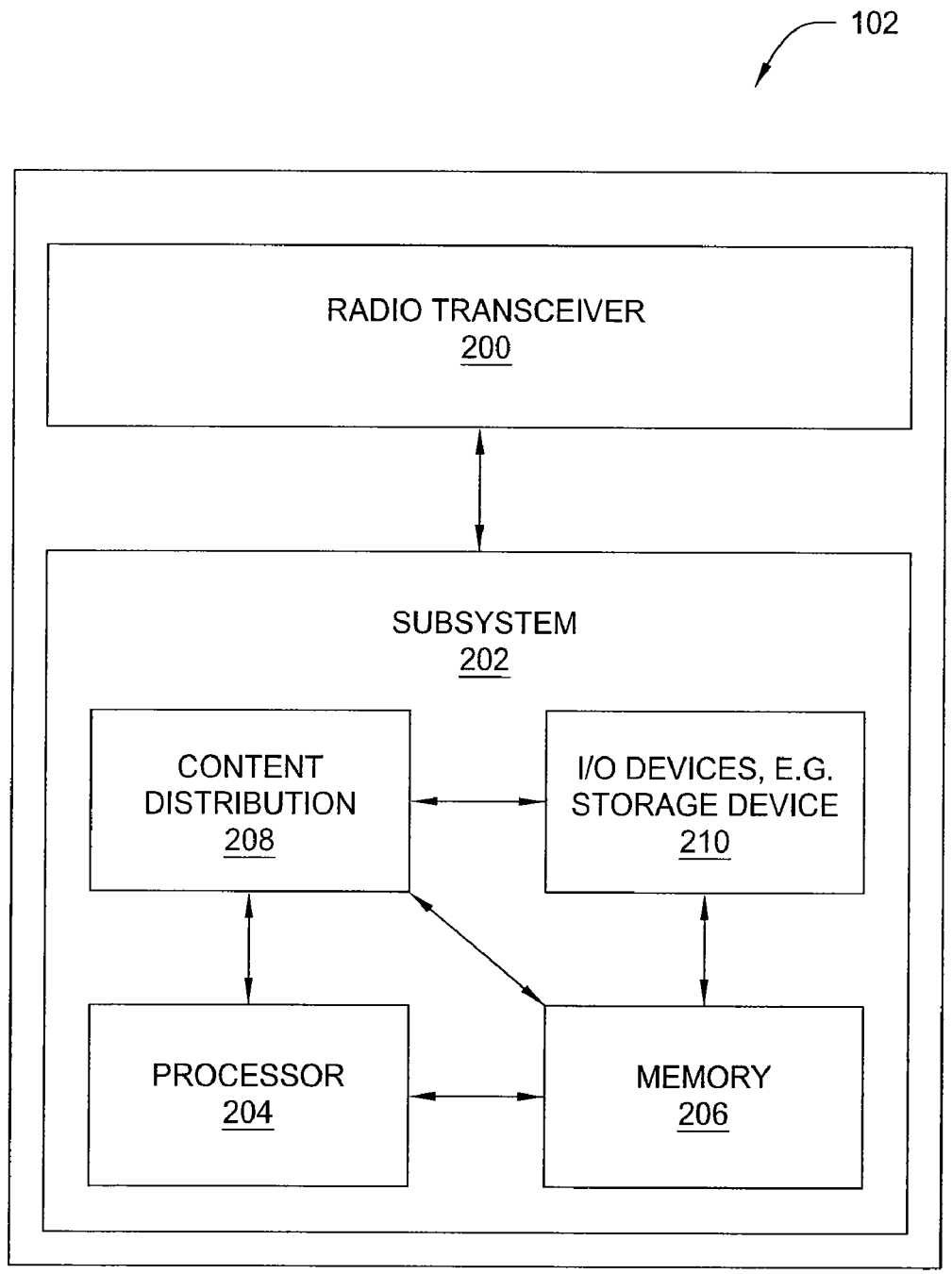
FIG. 2 is a high-level block diagram illustrating one embodiment of the server illustrated in FIG. 1, according to the present invention.

FIG. 2 is a high-level block diagram illustrating one embodiment of the server 102 illustrated in FIG. 1, according to the present invention. As illustrated, the server 102 comprises a radio transceiver 200 coupled to a server subsystem 202.

The radio transceiver 200 is configured to push a data stream including content to one or more of the mobile devices 104. In one embodiment, the radio transceiver 200 is configured to operate over a very high frequency (VHF)/amplitude modulation (AM)/frequency modulation (FM) network.

The subsystem 202 is configured to manage interfaces and interactions between the radio transceiver 200 and the VHF/AM/FM network. In one embodiment, interfaces and interactions that are managed by the subsystem 202 include content transmission (e.g., for transmitting content over the VHF/AM/FM network to the mobile devices 104).

To this end, the subsystem 202 may be configured in a manner similar to a general purpose computing device. In one embodiment, the subsystem 202 comprises a processor 204, a memory 206, a content distribution module 208 and various input/output (I/O) devices 210 such as a display, a keyboard, a mouse, a stylus, a wireless network access card, and the like. In one embodiment, at least one I/O device is a storage device (e.g., a disk drive, an optical disk drive, or a floppy disk drive). It should be understood that the content distribution module 208 can be implemented as a physical device or subsystem that is coupled to a processor through a communication channel.

Alternatively, the content distribution module 208 can be represented by one or more software applications (or even a combination of software and hardware, e.g., using Application Specific Integrated Circuits (ASIC)), where the software is loaded from a storage medium (e.g., I/O devices 210) and operated by the processor 204 in the memory 206 of the subsystem 202 Thus, in one embodiment, the content distribution module 208 for distributing targeted content to mobile user devices, as described herein, can be stored on a computer readable storage medium (e.g., RAM, magnetic or optical drive or diskette, and the like). One embodiment of a method of operation for the content distribution module 208 is discussed in greater detail with respect to FIG. 4.

Figure 3:
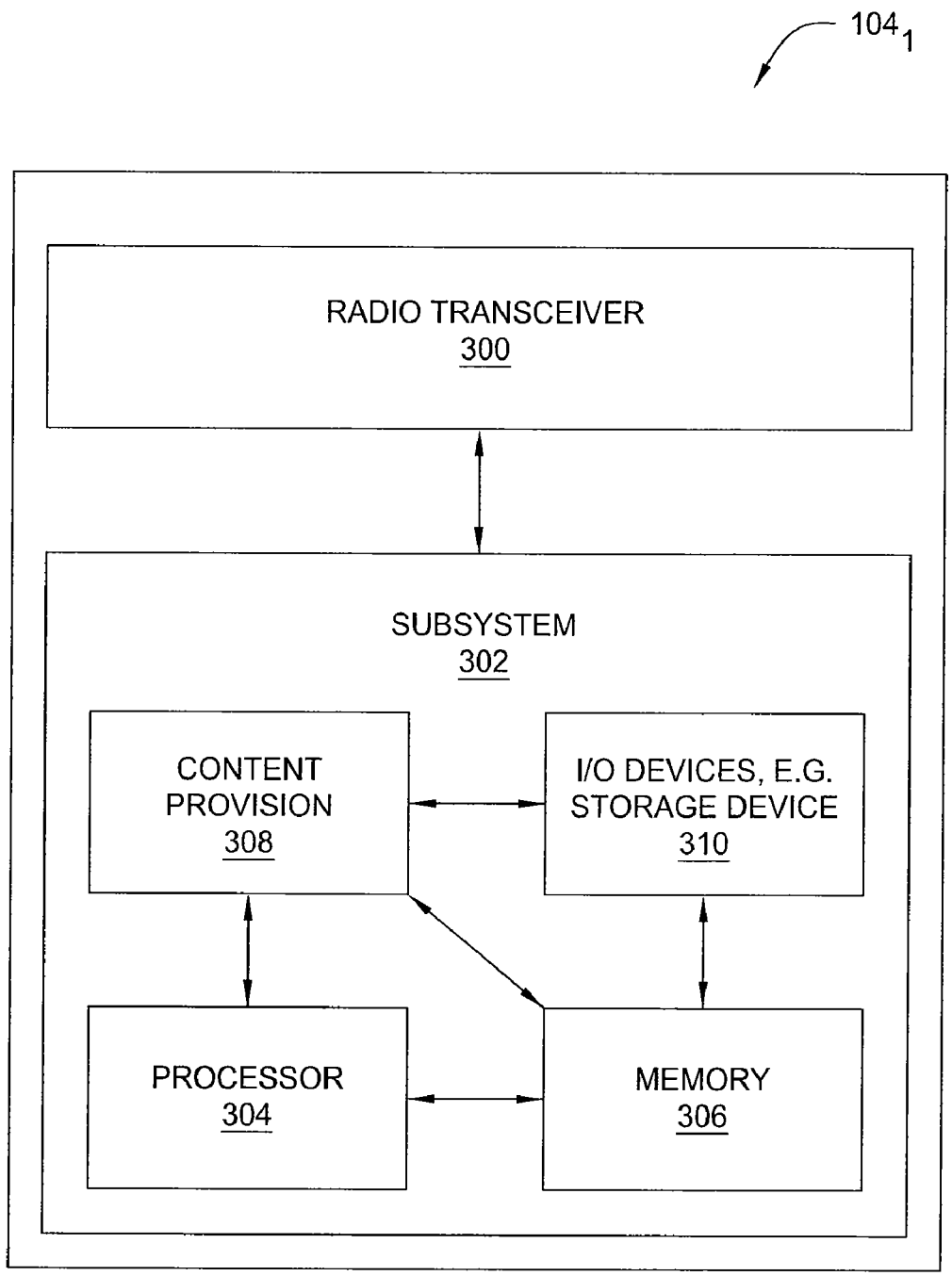
FIG. 3 is a high-level block diagram illustrating one embodiment of the mobile device illustrated in FIG. 1, according to the present invention.

FIG. 3 is a high-level block diagram illustrating one embodiment of the mobile device $104_1$ illustrated in FIG. 1, according to the present invention. In one embodiment, all of the mobile devices 104 are configured in a manner substantially similar to the mobile device $104_1$; thus the mobile device $104_1$ illustrated in FIG. 3 may be considered as representative of the mobile devices 104 illustrated in FIG. 1. In one embodiment, the mobile device $104_1$ is a radio terminal. As illustrated, the mobile device $104_1$ comprises a radio transceiver 300 coupled to a mobile device subsystem 302.

The radio transceiver 300 is configured to receive a data stream including content from the server 102 or from another mobile device 104. In a further embodiment, the radio transceiver is also configured to send a data stream including content to other mobile devices 104. In one embodiment, the radio transceiver 300 is configured to operate over a VHF/AM/FM network.

The subsystem 302 is configured to manage interfaces and interactions between the radio transceiver 300 and the VHF/AM/FM network. In one embodiment, interfaces and interactions that are managed by the subsystem 302 include content reception (e.g., for receiving content over the VHF/AM/FM network from the server 102).

To this end, the subsystem 302 may be configured in a manner similar to a general purpose computing device. In one embodiment, the subsystem 302 comprises a processor 304, a memory 306, a content provision module 308 and various input/output (I/O) devices 310 such as a display, a keyboard, a mouse, a stylus, a wireless network access card, and the like. In one embodiment, at least one I/O device is a storage device (e.g., a disk drive, an optical disk drive, a floppy disk drive). It should be understood that the content provision module 308 can be implemented as a physical device or subsystem that is coupled to a processor through a communication channel.

Alternatively, the content provision module 308 can be represented by one or more software applications (or even a combination of software and hardware, e.g., using Application Specific Integrated Circuits (ASIC)), where the software is loaded from a storage medium (e.g., I/O devices 310) and operated by the processor 304 in the memory 306 of the subsystem 302 Thus, in one embodiment, the content provision module 308 for playing targeted content on a mobile user device, as described herein, can be stored on a computer readable storage medium (e.g., RAM, magnetic or optical drive or diskette, and the like). One embodiment of a method of operation for the content provision module 308 is discussed in greater detail with respect to FIG. 5.

Figure 4:
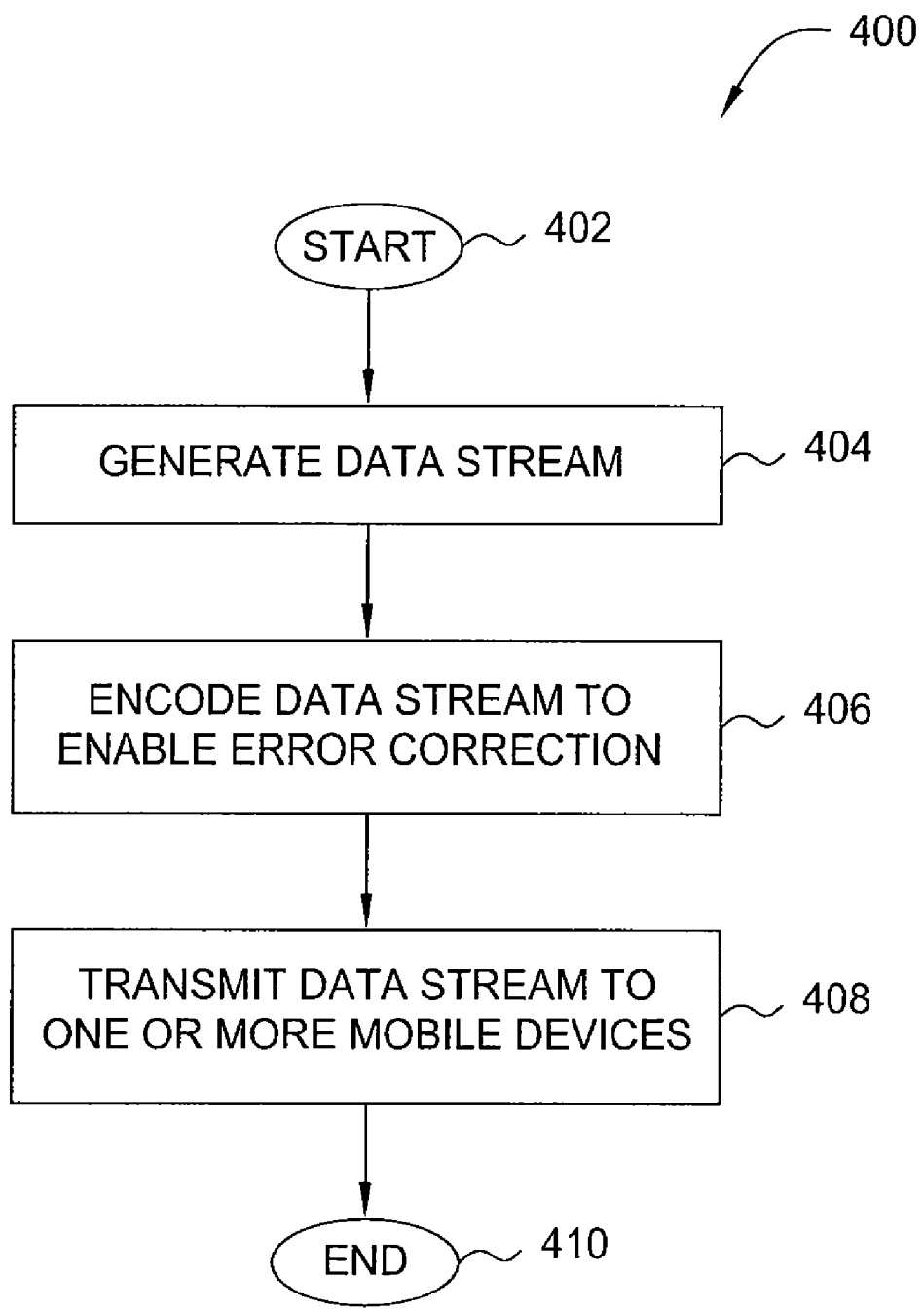
FIG. 4 is a flow diagram illustrating one embodiment of a method for distributing dynamically reconfigurable content to one or more mobile devices.

FIG. 4 is a flow diagram illustrating one embodiment of a method 400 for distributing content to one or more mobile devices. The method 400 may be implemented, for example, by the server 102 illustrated in FIGS. 1 and 2.

The method 400 is initialized at step 402 and proceeds to step 404, where the method 400 generates a data stream for distribution to one or more mobile devices. In one embodiment, the data stream includes at least one of: digital data and analog data. In one embodiment, the digital and/or analog data in the data stream includes media such as at least one of: interactive content, an image, a video, an audio clip, or text.

In step 406, the method 400 encodes the data stream to enable error correction. The method 400 then proceeds to step 406 and transmits the data stream to one or more mobile devices. In one embodiment, the data stream is sent over at least one of: a digital channel and an analog channel. In one embodiment, the digital channel is an RBDS channel. RBDS is a secondary digital sub-channel used by FM radio stations to broadcast bit streams within the 87.5 to 108 MHz frequency band.

Having transmitted the data stream, the method 400 terminates in step 410.

Figure 5:
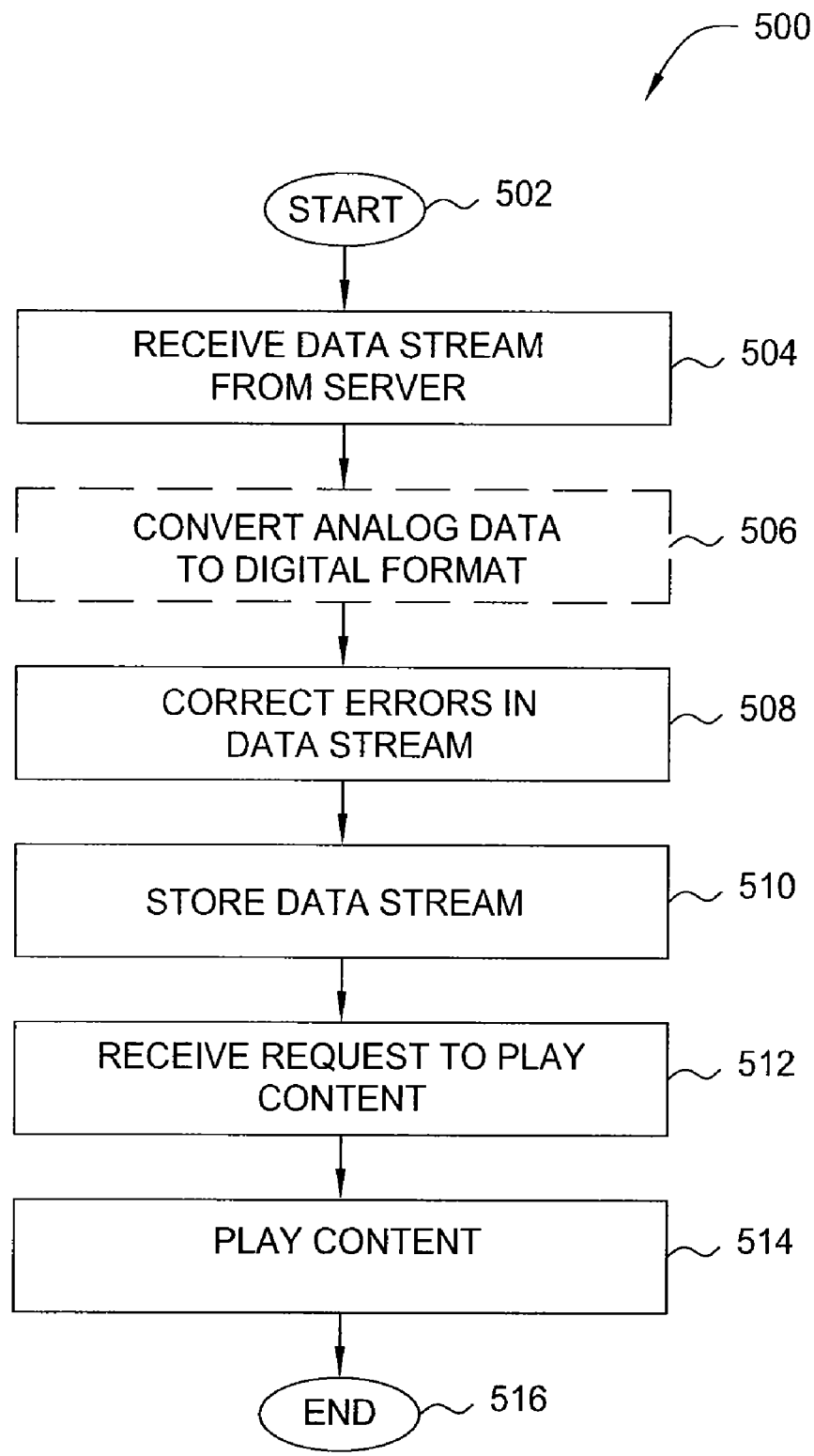
FIG. 5 is a flow diagram illustrating one embodiment of a method for receiving and playing dynamically reconfigurable content on a mobile device.

FIG. 5 is a flow diagram illustrating one embodiment of a method 500 for receiving and playing content on a mobile device. The method 500 may be implemented, for example, by one or more of the mobile devices 104 illustrated in FIGS. 1 and 3.

The method 500 is initialized at step 502 and proceeds to step 504, where the method 500 receives a data stream from the server. In one embodiment, the data stream comprises at least one of: digital data and analog data. In one embodiment, the data in the data stream includes content comprising at least one of: interactive content, an image, a video, an audio clip, or text.

In one embodiment, the data stream is received over at least one of: a digital channel and an analog channel. In one specific embodiment, the data stream is received over an RBDS channel. Thus, in one embodiment, the data stream is received as part of a radio (e.g., FM) broadcast.

In step 506 (illustrated in phantom), the method 500 converts any analog data in the received data stream to digital format. In step 508, the method 500 corrects errors in the received data stream. One embodiment of a method for correcting errors in the received data stream is discussed in further detail below.

In step 510, the method 500 stores the data stream, for example in a buffer in the memory of the mobile device. In step 512, the method 500 receives a user request to play content on the mobile device. For instance, the user request may be a request to load a video game that is stored on the mobile device.

In step 514, the method 500 plays the requested content. The method 500 then terminates in step 516.

As discussed above, some embodiments of the invention utilize FM radio, RBDS, or radio data system (RDS) to transfer data streams. Conventionally, these protocol standards have been used to transfer only very limited amounts of data, because these protocol standards tend to be subject to errors even with heavy forward error correction. As embodiments of the present invention may require the transmission of much larger amounts of data, these embodiments would benefit from additional error correction to mitigate the long temporal fade of errors typically found in FM, RBDS, and RDS communication channels (i.e., because the errors occur in bursts rather than at random, any burst of bit-errors is broken into a set of scattered single-bit errors when the bits of the message are de-interleaved before decoding, resulting in the reception of uncorrectable errors). In one embodiment, this additional error correction is enhanced by compressing the data stream to minimize the length of the transmission.

In one embodiment, the present invention employs an error correction technique that relies on the fact that, even if an uncorrectable error is detected in a given data stream, it is unlikely that the same error occurs at the same point (or points) in every data stream. Thus, even data streams containing errors will contain useful information. Embodiments of the present invention exploit this fact in order to provide enhanced error correction functionality (for example by performing error correction encoding at the server side prior to transmission of a data stream and/or by providing additional error correction decoding at the mobile device side after reception of a data stream) at minimum transmission cost.

Figure 6:
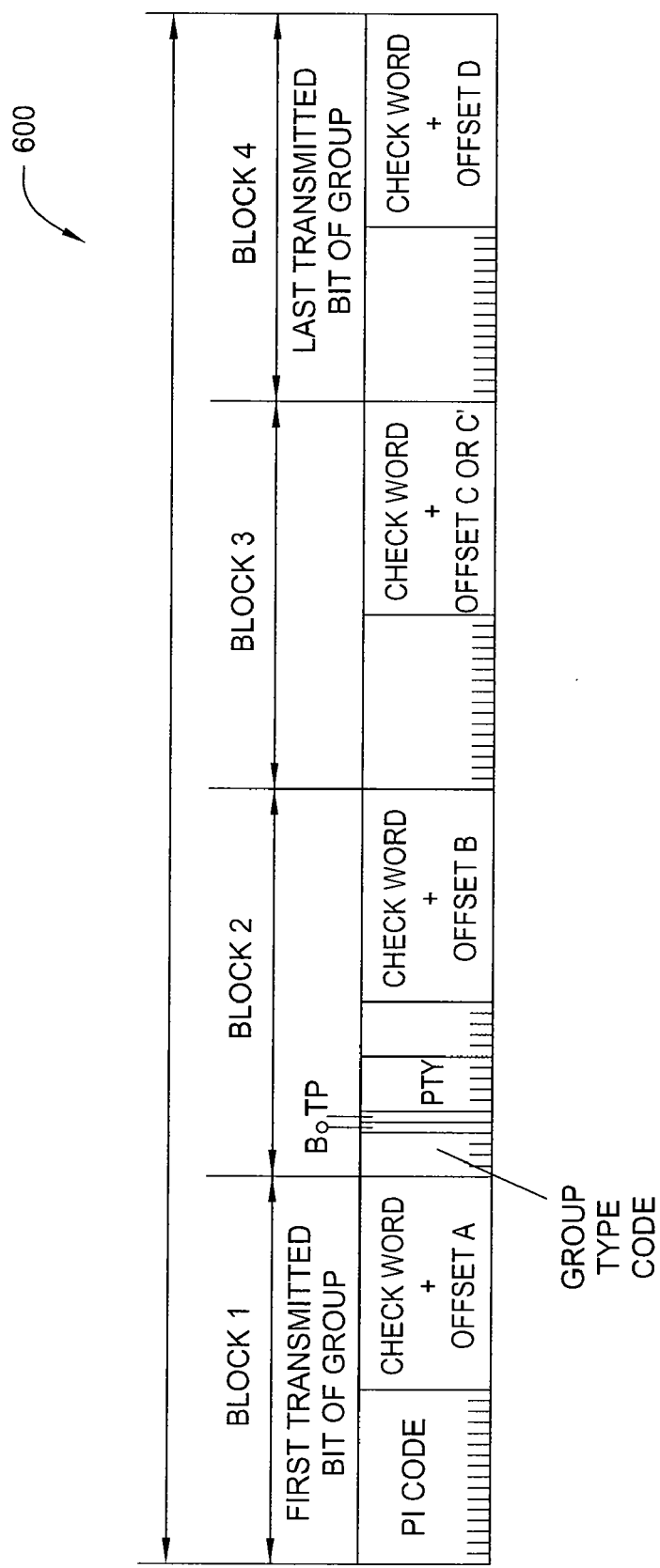
FIG. 6 illustrates an exemplary data structure for transmitting radio broadcast data system data bits.

FIG. 6 illustrates an exemplary data structure (payload) 600 for transmitting RBDS data bits. Conventionally, RBDS and RDS transmit bits in 104-bit groups, where each group is broken up into four twenty-six-bit blocks (Block 1, Block 2, Block 3, and Block 4 in FIG. 6). Of the twenty-six bits in each block, ten are used for error correction coding (labeled as "Checkword+offset A/B/C or C'/D" in FIG. 6). The first four bits in the second block (Block 2) are used to identify the type of group being transmitted, while the fifth bit in the second block identifies the version of the group type. There are sixteen possible group types (numbered 0-15), and each group type has two possible versions (A or B). Different RBDS or RDS features are allocated to each group type, and a few features are common to all groups.

Figure 7:
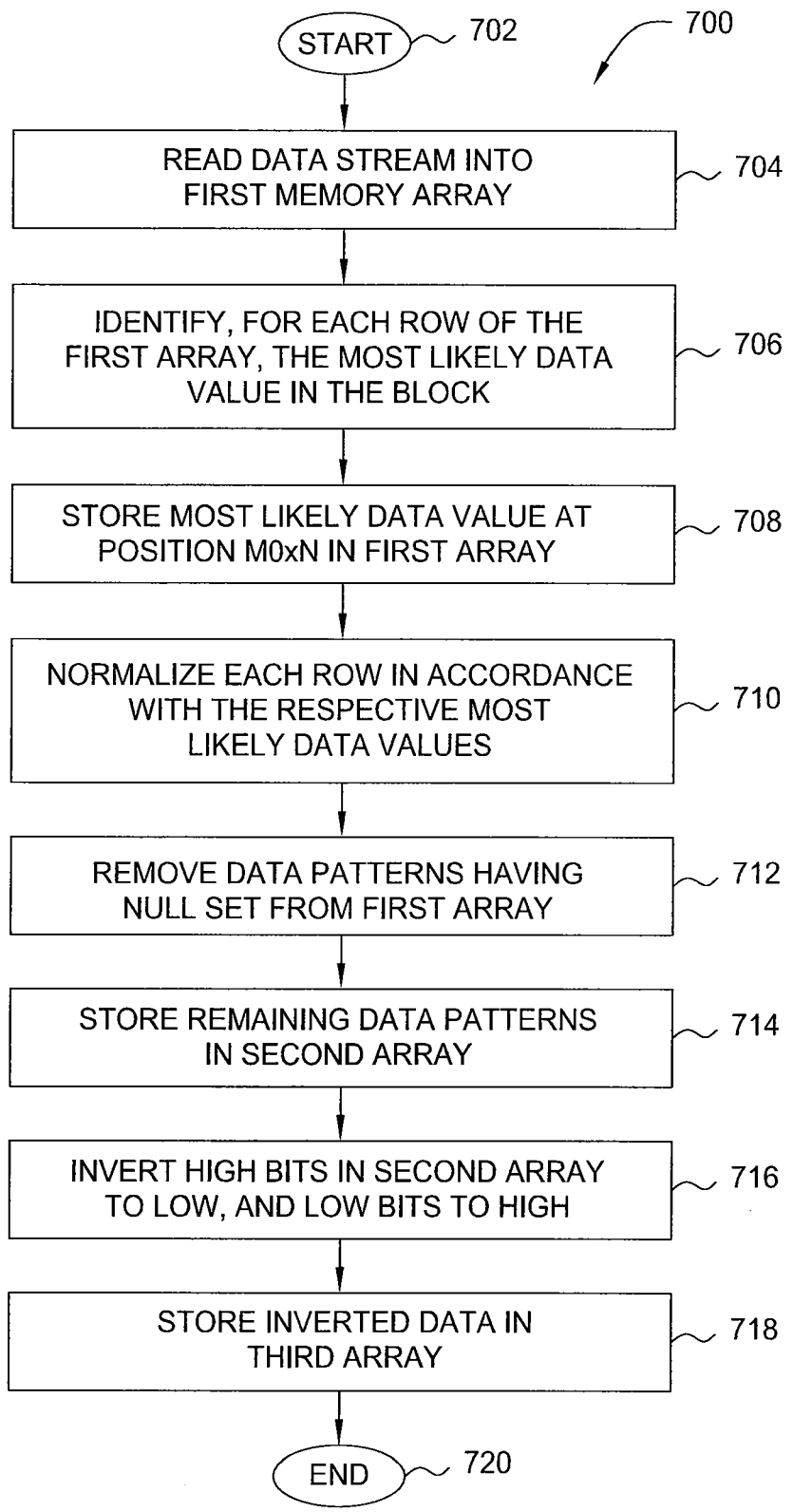
FIG. 7 is a flow diagram illustrating one embodiment of a method for encoding a data stream to enable error correction, according to the present invention.

Keeping in mind the data structure 600 illustrated in FIG. 6, FIG. 7 is a flow diagram illustrating one embodiment of a method 700 for encoding a data stream to enable error correction, according to the present invention. The method 700 may be implemented, for example, at the server 102 illustrated in FIGS. 1 and 2.

The method 700 is initialized at step 702 and proceeds to step 704, where the method 700 reads and stores the data stream into a first memory array. In one embodiment, the first array is an (M+1)×N array. In one embodiment, the number M of columns can be as small as one or as large as sixty four, while the number N of rows can be as small as one or as large as thirty-two.

FIG. 8, for example, illustrates an exemplary (M+1)×N array 800 that may be used to store the data stream. For the purposes of illustration, the data in columns M3-M7 of row N6 and rows N4-N8 of column M5 in the array 800 contain the data pattern "0×FF," thereby forming a cross pattern in the array 800.

Referring back to FIG. 7, in step 706, the method 700 identifies, by examining each row in the first array, the most likely data value in the block M,N of the first array (which corresponds to either Block 3 or Block 4 of FIG. 6). In one embodiment, the most likely data value is the highest recurring value in the row. In one embodiment, the method 700 makes this identification by applying a first filter to each row of the first array.

In step 708, the method 700 stores the most likely data value in the first array. In one embodiment, the most likely data value is stored in the M0 column of the first array for each row N. FIG. 12, for example, illustrates the array 800 of FIG. 8, in which the most likely data value for each row N is stored in the M0 column.

In step 710, the method 700 normalizes the range of values in each row of the first array, in accordance with the respective most likely data value identified for each row. Normalization achieves the maximum number of data patterns having a null set (0×00) in each row. FIG. 13, for example, illustrates the array 800 of FIG. 8 after normalization.

In step 712, the method 700 removes any data patterns having a null set from the first array. This minimizes the data set that is to be ultimately transmitted. In one embodiment, removal of null sets in achieved by applying a second filter to the first array.

In step 714, the method 700 stores the remaining data (i.e., the data patterns that do not contain null sets) in a second array. In one embodiment, the second array maintains the index as assigned to the first array in step 704.

In step 716, the method 700 inverts the second array. Specifically, the method 700 performs a logical operation that inverts each high bit in the second array to a low bit, and inverts each low bit in the second array to a high bit. This inversion provides the maximum entropy for each data bit to be transmitted.

In step 718, the method 700 stores the inverted data in a third array. In one embodiment, the third array maintains the index as assigned to the first array in step 704. FIG. 14, for example, illustrates an exemplary third array 1400 in which the inverted data is stored. The method 700 then terminates in step 720.

Figure 9:
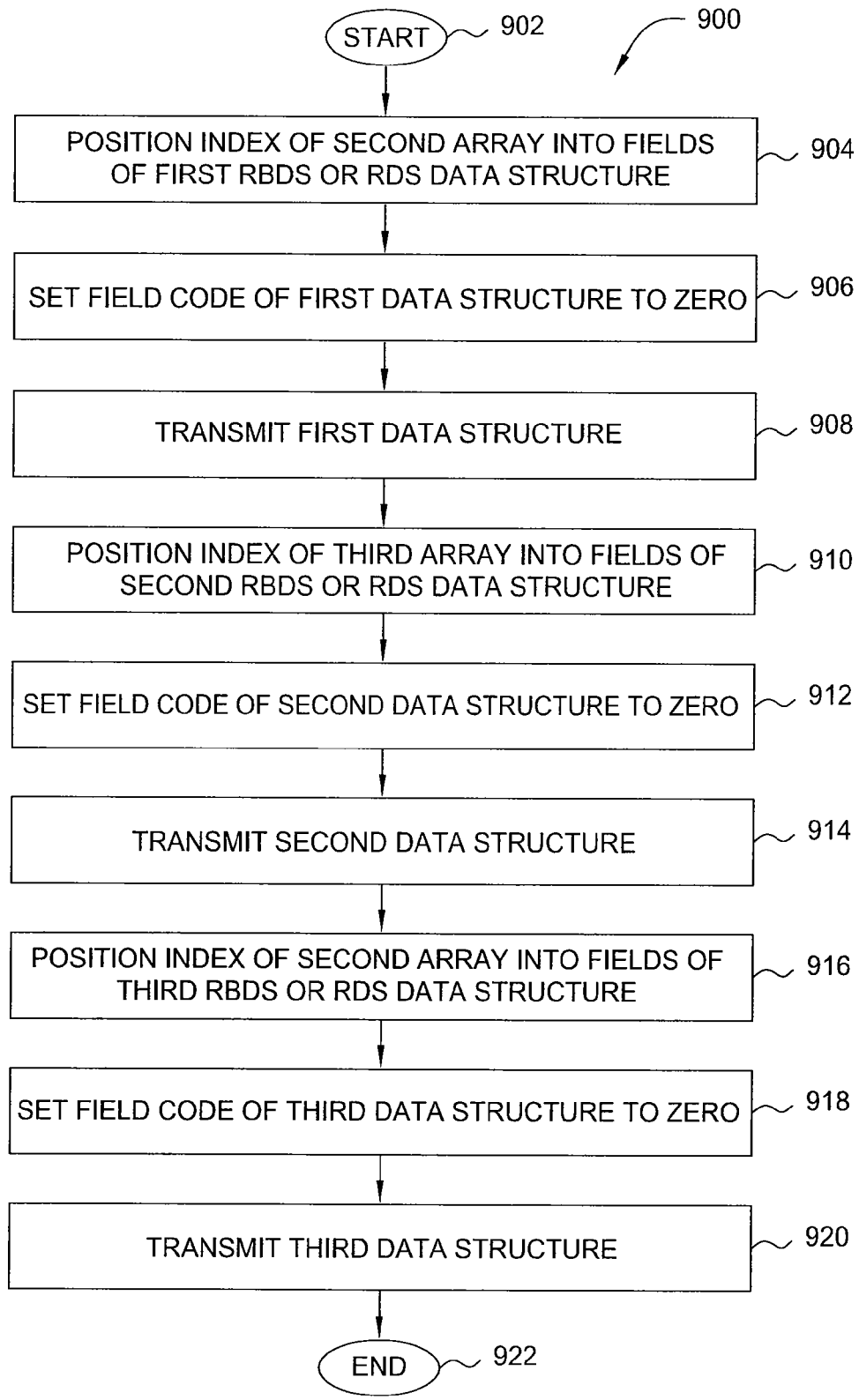
FIG. 9 is a flow diagram illustrating one embodiment of a method for transmitting a data stream encoded with error correction coding, according to the present invention.

FIG. 9 is a flow diagram illustrating one embodiment of a method 900 for transmitting a data stream encoded with error correction coding, according to the present invention. The method 900 operates in conjunction with the method 700 to transmit data from the second and third arrays generated by the method 700. The method 900 may be implemented, for example, at the server 102 illustrated in FIGS. 1 and 2.

The method 900 is initialized at step 902 and proceeds to step 904, where the method 900 positions the index of the second array into the fields of a first RBDS or RDS data structure, such as the data structure 600 illustrated in FIG. 6.

FIG. 10 illustrates an exemplary data structure (payload) 1000 for transmitting RBDS data bits. The configuration of the data structure 1000 is substantially identical to the configuration of the data structure 600 illustrated in FIG. 6. However, the data structure 1000 has been modified with index information from the second array in accordance with the method 900. In one embodiment, positioning the index of the second array into the first data structure 1000 includes placing the column addresses M6-M0 of the second array into the most significant bits of Block 3 of the first data structure

1000, as illustrated. In addition, the row addresses N5-N0 of the second array are placed into the next most significant bits of Block 3.

The value of the data at this index in the second array is placed in Block 4 of the first data structure 1000 as a sixteen-bit word (i.e., d15-d0), as illustrated. In alternate embodiments, a lesser number of bits can be placed in Block 4. Finally, a five-bit value representing the file identifier is placed into the five least significant bits of Block 2 of the first data structure. In one embodiment, this positioning is performed using a conventional RBDS or RDS encoder.

Referring back to FIG. 9, in step 906, the method 900 sets the field code of the first data structure to zero. In one embodiment, this is accomplished by setting a field code value of 0×01 in the three least significant bits of Block 3 of the first data structure, as illustrated in FIG. 10. The method 900 then proceeds to step 908 and transmits the first data structure, for example using standard equipment for RBDS or RDS.

In step 910, the method 900 positions the index of the third array into the fields of a second RBDS or RDS data structure. In one embodiment, positioning the index of the third array into the second data structure is performed in a manner similar to the positioning of the second array into the first data structure, as described above with respect to step 904 (e.g., data from the same locations in the third array are placed in the same positions in the second data structure). In one embodiment, this positioning is performed using a conventional RBDS or RDS encoder.

In step 912, the method 900 sets the field code of the second data structure to one. In one embodiment, this is accomplished by setting a field code value of 0×02 in the three least significant bits of Block 3 of the second data structure, as illustrated in FIG. 10. The method 900 then proceeds to step 914 and transmits the second data structure, for example using standard equipment for RBDS or RDS.

In step 916, the method 900 positions the index of the second array into the fields of a third RBDS or RDS data structure. In one embodiment, positioning the index of the second array into the third data structure is performed in a manner similar to the positioning of the second array into the first data structure, as described above with respect to step 904 (e.g., data from the same locations in the second array are placed in the same positions in the third data structure). In one embodiment, this positioning is performed using a conventional RBDS or RDS encoder.

In step 918, the method 900 sets the field code of the third data structure to two. In one embodiment, this is accomplished by setting a field code value of 0×03 in the three least significant bits of Block 3 of the third data structure, as illustrated in FIG. 10. The method 900 then proceeds to step 920 and transmits the second data structure, for example using standard equipment for RBDS or RDS. The method 900 then terminates in step 922.

Figure 11:
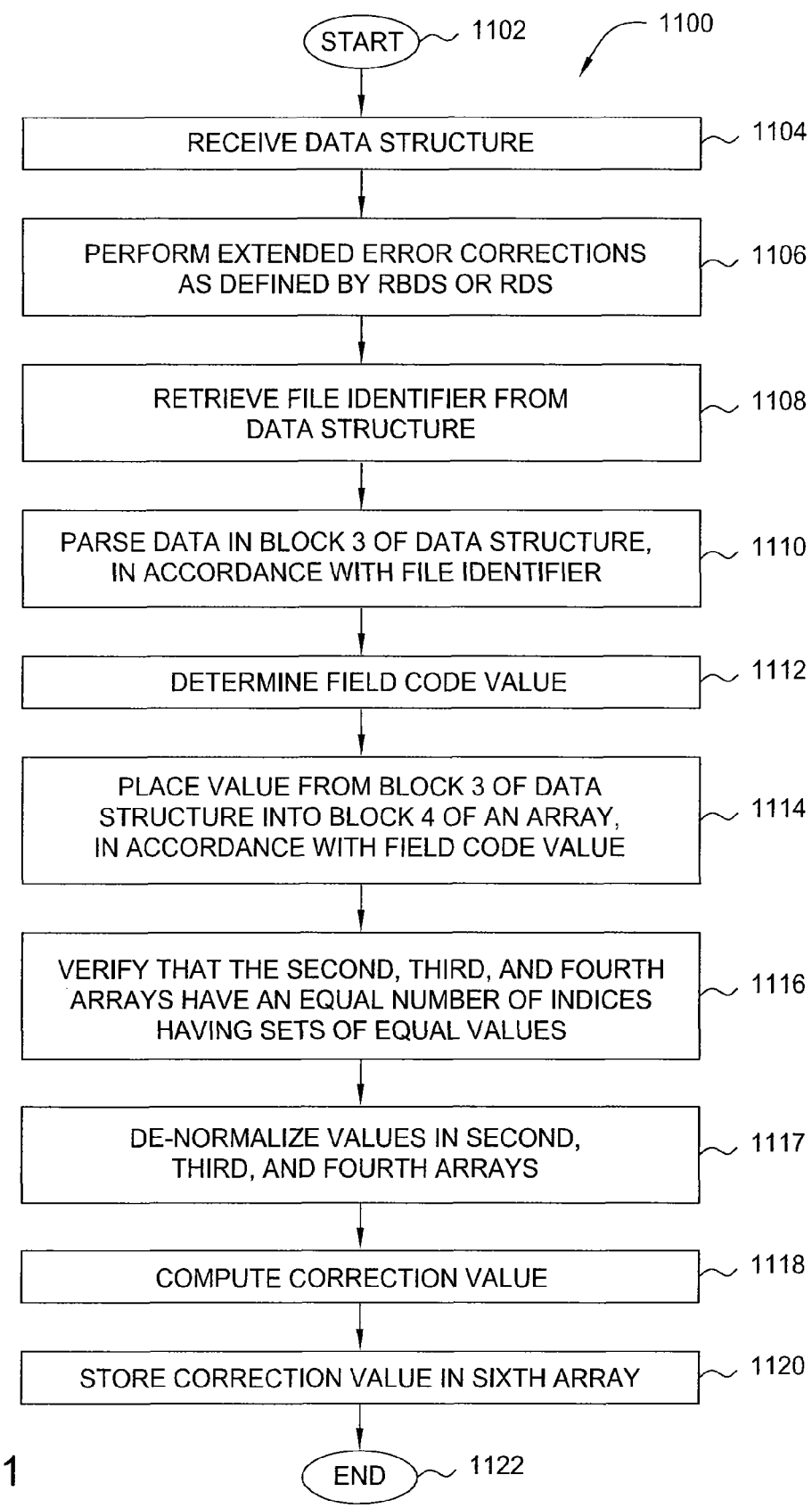
FIG. 11 is a flow diagram illustrating one embodiment of a method for performing error correction on received data, according to the present invention.

FIG. 11 is a flow diagram illustrating one embodiment of a method 1100 for performing error correction on received data, according to the present invention. The method 1100 may be implemented, for example, in the mobile devices 104 of FIG. 1.

The method 1100 is initialized at step 1102 and proceeds to step 1104, where the method 1100 receives a data structure, for example using standard equipment for RBDS or RDS. The method 1100 then performs extended error correction (EEC) on the data structure in step 1106, as defined by RBDS or RDS.

In step 1108, the method 1100 retrieves the file identifier from the data structure. In one embodiment, the file identifier is retrieved by parsing the five least significant bits from Block 2 of the data structure, as discussed above. The file identifier is then set to the value contained at this position in the data structure.

In step 1110, the method 1100 identifies the value at a specified index in the second array, in accordance with the file identifier. Specifically, the method 1100 parses the data contained in the data structure, in accordance with the file identifier. In one embodiment, this involves parsing the data in Block 3 of the data structure, as illustrated in FIG. 10, using the column address M6-M0 and the row address N5-N0 into the next most significant bits and the field code value.

In step 1112, the method 1100 determines the value in the field code of the data structure. In one embodiment, the field code value is 0×01, 0×02, or 0×03, as discussed above.

In step 1114, the method 1100 places the value parsed from Block 3 of the data structure (i.e., in step 1110) into Block 4 of an array as a sixteen-bit word (e.g., as illustrated in FIG. 10). In one embodiment, if the field code value is 0×01, the value parsed from Block 3 of the data structure is placed at the corresponding M×N index in the second array; if the field code value is 0×02, the value parsed from Block 3 of the data structure is placed at the corresponding M×N index in the third array; or if the field code value is 0×03, the value parsed from Block 3 of the data structure is placed at the corresponding M×N index in a fourth array. FIG. 15, for example, illustrates an exemplary second array 1500 in which random errors are contained; FIG. 16 illustrates an exemplary third array 1600 in which random errors are contained; and FIG. 17 illustrates an exemplary fourth array 1700 in which random errors are contained.

In step 1116, the method 1100 scans the values of the second, third, and fourth arrays in order to verify that the second, third, and fourth arrays have an equal number of indices, and that these indices have an equal set of values. In one embodiment, any exceptions are stored in a fifth array.

In step 1117, the method 1100 de-normalizes the values in the second, third, and fourth arrays using the de-normalization seed found in the first column of each row.

Figure 18:
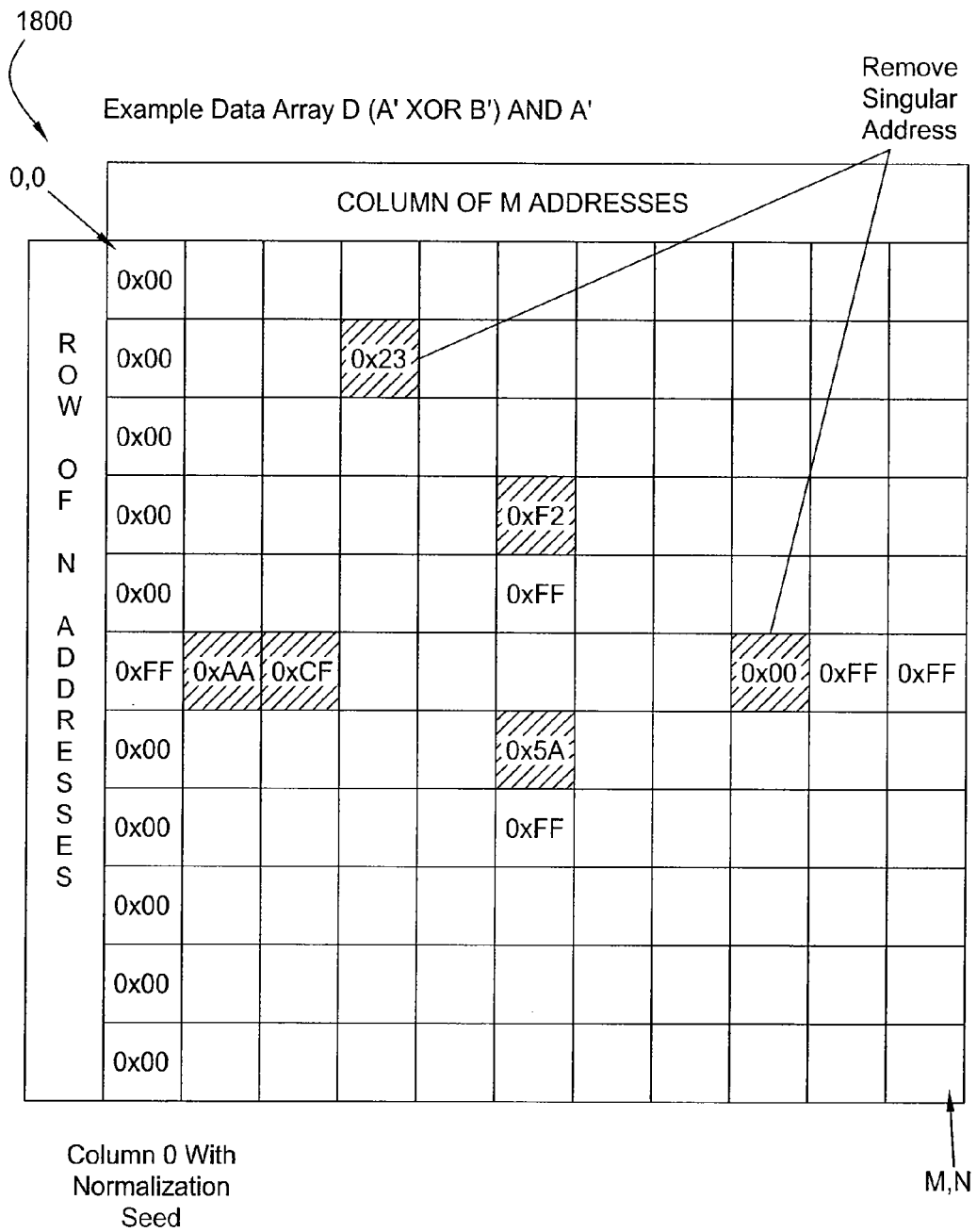
FIG. 18 illustrates an exemplary array representing the operation (A' XOR B') AND A'.

In step 1118, the method 1100 computes a correction value. In one embodiment, the correction value is computed, using the same M×N index discussed above, as a bitwise logical operation:

((A' XOR B') AND A') OR ((B' XOR C') AND C') OR (A' AND C')

where A' represents the second array, B' represents the third array, and C' represents the fourth array. FIG. 18, for example, illustrates an exemplary array 1800 representing the operation (A' XOR B') AND A'; FIG. 19 illustrates an exemplary array 1900 representing the operation (B' XOR C') AND C'; and FIG. 20 illustrates an exemplary array 2000 representing the operation (A' AND C').

In step 1120, the method 1100 stores the correction value in a sixth array. FIG. 21, for example, illustrates an exemplary sixth array 2100 in which the correction value is stored. In one embodiment, the address at which the correction value is stored corresponds to the M×N index discussed above. The method 1100 then terminates in step 1122. The correction value stored in the sixth array may subsequently be read out at any time using the M×N index.

It should be noted that although not explicitly specified, one or more steps of the methods described herein may include a storing, displaying and/or outputting step as required for a particular application. In other words, any data, records, fields, and/or intermediate results discussed in the methods can be stored, displayed, and/or outputted to another device as required for a particular application. Furthermore, steps or blocks in the accompanying Figures that recite a determining operation or involve a decision, do not necessarily require that both branches of the determining operation be practiced. In other words, one of the branches of the determining operation can be deemed as an optional step.

Although various embodiments which incorporate the teachings of the present invention have been shown and described in detail herein, those skilled in the art can readily devise many other varied embodiments that still incorporate these teachings.

What is claimed is:

1. A method for encoding a data stream to enable error correction by a receiver of the data stream, the method comprising:
   storing a block of the data stream in a first memory array;
   processing the first memory array to produce a second memory array;
   inverting the second memory array; and
   storing the second memory array, as inverted, as a third memory array, wherein each of the second memory array and the third memory array maintains an index assigned to the first memory array,
   wherein at least one of: the storing the block, the processing, the inverting, or the storing the second memory array is performed using a processor.

2. The method of claim 1, wherein the inverting comprises:
   inverting each high bit in the second memory array to a low bit; and
   inverting each low bit in the second memory array to a high bit.

3. The method of claim 1, further comprising:
   positioning an index of the second memory array into a field of a payload of a first message;
   positioning an index of the third memory array into a field of a payload of a second message;
   positioning an index of the second memory array into a field of a payload of a third message; and
   transmitting the first message, the second message, and the third message.

4. The method of claim 3, wherein the message payload is associated with a radio broadcast data system or a radio data system.

5. The method of claim 3, further comprising:
   setting a field code associated with the first message to zero;
   setting a field code associated with the second message to one; and
   setting a field code associated with the third message to two.

6. The method of claim 1, wherein the processor is part of a handheld device.

7. The method of claim 1, wherein each of the first memory array, the second memory array, and the third memory array has (M+1) columns and N rows.

8. The method of claim 7, wherein M is a number between and including one and sixty-four.

9. The method of claim 7, wherein N is a number between and including one and thirty-two.

10. The method of claim 1, wherein the processing comprises:
    normalizing each row of the first memory array in accordance with a respective most likely data pattern; and
    storing non-null set data patterns from the first memory array in the second memory array.

11. The method of claim 10, wherein the normalizing comprises, for a given row of the first memory array:
    identifying a highest recurring value in the given row as the most likely data pattern for the given row; and
    storing the highest recurring value in the first column of the given row.

12. A computer readable storage medium containing an executable program for encoding a data stream to enable error correction by a receiver of the data stream, where the program performs the steps comprising:
    storing a block of the data stream in a first memory array;
    processing the first memory array to produce a second memory array;
    inverting the second memory array; and
    storing the second memory array, as inverted, as a third memory array, wherein each of the second memory array and the third memory array maintains an index assigned to the first memory array.

13. A method for performing error correction on a received message, the method comprising:
    parsing a portion of a payload of the message in accordance with a file identifier retrieved from the payload;
    placing data in the portion of the payload into one of a plurality of memory arrays; and
    calculating a correction value in accordance with a bitwise logical operation performed on the plurality of memory arrays; and
    storing the correction value in a memory array that is separate from the plurality of memory arrays,
    wherein at least one of: the parsing, the placing, or the calculating is performed using a processor.

14. The method of claim 13, wherein the message is associated with a radio broadcast data system or a radio data system.

15. The method of claim 14, further comprising:
    performing extended error correction as defined by the radio broadcast data system or the radio data system prior to the parsing.

16. The method of claim 13, wherein the processor is part of a handheld device.

17. The method of claim 13, wherein the placing comprises:
    retrieving a field code value from the payload; and
    selecting the one of the plurality of memory arrays in accordance with the field code value.

18. The method of claim 13, further comprising:
    verifying that all of the plurality of memory arrays have an equal number of indices, and that the indices all have equal sets of values, prior to the calculating.

19. The method of claim 13, wherein the bitwise logical operation comprises:
    ((A' XOR B') AND A') OR ((B' XOR C') AND C') OR (A' AND C'),
    wherein each of A', B', and C' represents one of the plurality of memory arrays.

20. A computer readable storage medium containing an executable program for performing error correction on a received message, where the program performs the steps comprising:
    parsing a portion of a payload of the message in accordance with a file identifier retrieved from the payload;
    placing data in the portion of the payload into one of a plurality of memory arrays; and
    calculating a correction value in accordance with a bitwise logical operation performed on the plurality of memory arrays; and
    storing the correction value in a memory array that is separate from the plurality of memory arrays.

* * * * *